(12) United States Patent
Liu et al.

(10) Patent No.: US 11,818,867 B2
(45) Date of Patent: Nov. 14, 2023

(54) HEAT DISSIPATION UNIT WITH FLOATING SECTION

(71) Applicant: ASIA VITAL COMPONENTS (CHINA) CO., LTD., Shenzhen (CN)

(72) Inventors: Han-Min Liu, Shenzhen (CN); Xiao-Xiang Zhou, Shenzhen (CN)

(73) Assignee: ASIA VITAL COMPONENTS (CHINA) CO., LTD., Shenzhen (CN)

( * ) Notice: Subject to any disclaimer, the term of this patent is extended or adjusted under 35 U.S.C. 154(b) by 0 days.

(21) Appl. No.: 17/317,896

(22) Filed: May 12, 2021

(65) Prior Publication Data

US 2022/0369511 A1 Nov. 17, 2022

(51) Int. Cl.
*H05K 7/20* (2006.01)
*F28D 15/02* (2006.01)

(52) U.S. Cl.
CPC ..... *H05K 7/20336* (2013.01); *F28D 15/0241* (2013.01)

(58) Field of Classification Search
CPC ............ H05K 7/20336; F28D 15/0241; F28D 15/0233
See application file for complete search history.

(56) References Cited

U.S. PATENT DOCUMENTS 10,517,192 B2 * 12/2019 Hsiao .................. F28D 15/0233
2014/0054009 A1 * 2/2014 Chang ................. F28D 15/0233
165/104.11

FOREIGN PATENT DOCUMENTS

| JP | 2007100992 A | * | 4/2007 | ......... F28D 15/0233 |
| TW | M616497 U | | 9/2021 | |
| WO | 2020232377 A1 | | 11/2020 | |

OTHER PUBLICATIONS

Search Report dated May 16, 2022 issued by Taiwan Intellectual Property Office for counterpart application No. 110116821.

* cited by examiner

*Primary Examiner* — Tavia Sullens
*Assistant Examiner* — Khaled Ahmed Ali Al Samiri
(74) *Attorney, Agent, or Firm* — Demian K. Jackson; Jackson IPG PLLC

(57) ABSTRACT

A heat dissipation unit with floating section includes an upper plate and a lower plate, which are closed together to define a chamber in between them, and the chamber has a working fluid filled therein. The upper and the lower plate respectively include a front section, a read section, and a middle section located between the front and the rear section. The front section and the rear section of one or both of the upper and the lower plate have a plate thickness larger than that of the middle section, such that the middle sections form flexible floating sections that allow for a floating adjustment thereat, making the front and the rear sections of the heat dissipation unit to be located at two positions having a height difference between them.

6 Claims, 3 Drawing Sheets

HEAT DISSIPATION UNIT WITH FLOATING SECTION

FIELD OF THE INVENTION

The present invention relates to a heat dissipation unit with floating section, and more particularly, to a heat dissipation unit with floating section, which enables a floating adjustment of the heat dissipation unit at a floating section thereof to cover height difference between heat sources without causing a structural deformation of the heat dissipation unit.

BACKGROUND OF THE INVENTION

A heat pipe is a hollow metal pipe, in which an adequate amount of working fluid is filled. The principle for the heat pipe to dissipate heat is the two-phase change of the working fluid in the heat pipe. More specifically, the working fluid absorbs heat from a heat source located corresponding to an evaporator section that is located at an end of the heat pipe, such that the working fluid is finally vaporized and changes from a liquid phase into a vapor phase. The vaporized working fluid diffuses in the heat pipe and carries the absorbed heat through a thermal insulated section to a condenser section located at another end of the heat pipe to achieve the purpose of transferring heat to a remote location relative to the heat source.

The currently available heat pipe is usually used with a heat dissipation unit, such as snap-on fins or aluminum-extruded fins or a heat sink, to form a thermal module, which is mounted in an electronic device, such as a computer, a server, a communication chassis, a mobile phone or a hand-held device, to dissipate heat generated by heat sources on a mother board or a printed circuit board.

However, the packaged heat sources on the mother board or the printed circuit board of the electronic device are different in their heights. Therefore, it is very possible a height difference is existed between two heat sources and not all the evaporator sections of some heat pipes in the thermal module can be in flat contact with the heat sources. The heat pipe being forcefully connected to two heat sources having a height difference between them is subjected to the risk of reduced heat transfer efficiency or even malfunction. This is because the hollow pipe of the heat pipe is made of a metal sheet material having the same thickness, that is, the evaporator section, the thermal insulated section and the condenser section of the heat pipe are consistent in their pipe wall thickness. In the event the evaporator section or the condenser section of the heat pipe needs to be adjusted in its height location to cover the height difference between two heat sources and the thermal insulated section of the same pipe wall thickness is flexed or bent for this purpose, a bridging force between the evaporator section and the condenser section tends to pull and push the evaporator and the condenser section and to inward compress or outward pull the thermal insulated section, which would result in poor heat transfer efficiency or even malfunction of the heat pipe.

SUMMARY OF THE INVENTION

A primary object of the present invention is to provide a heat dissipation unit with a floating section, and a floating adjustment can be made at the floating section for two opposite ends of the heat dissipation unit to be simultaneously flatly located on heat sources having a height difference between them without causing a structural deformation or malfunction of the heat dissipation unit due to any bridging force generated for covering the height difference between the heat sources.

Another object of the present invention is to provide a heat dissipation unit including an upper plate and a lower plate, which respectively includes a front, a middle and a rear section; and the middle section of at least one of the upper and the lower plate has a plate thickness smaller than that of the front and the rear section, such that the middle section forms a flexible floating section that allows for a floating adjustment thereat for the front and the rear section to be correspondingly fitly mounted on heat sources or other types of heat dissipation units having a height difference between them.

To achieve the above and other objects, the heat dissipation unit with floating section according to the present invention includes an upper plate and a lower plate, which are closed together to define a chamber in between them, and the chamber has a working fluid filled therein. The upper and the lower plate respectively include a front section, a rear section, and a middle section located between the front and the rear section. The front and rear sections of any one or both of the upper and the lower plate have a plate thickness larger than that of the middle section, such that the middle section forms a flexible floating section allowing for a floating adjustment thereat.

With the above design, the heat dissipation unit with floating section according to the present invention is allowed for a floating adjustment at the flexible floating middle sections thereof to thereby cover a height difference between different heat sources without causing a structural deformation of the heat dissipation unit due to a bridging force generated when the heat dissipation unit is connected to locations having different height levels. Further, the present invention can also be used on various electronic devices, such as servers, computers or communication chassis that include heat-producing element having a height difference in location, so that two ends of the heat dissipation unit can always flatly contact with the corresponding heat sources or other similar or different types of heat dissipation units that have a height difference between them.

The chamber is provided on an inner side of the lower plate or on inner sides of the upper and the lower plate with a wick structure. And, the front and the rear sections have a plate thickness larger than or equal to 0.5 mm, while the middle section of at least one of the upper and the lower plate has a plate thickness of 0.08 mm and smaller than 0.5 mm.

The middle section of at least one of the upper and the lower plate is provided with a reinforcing rib. The reinforcing rib is connected to the front and the middle section, or connected to the middle and the rear section, or extended from the front section through the middle section to the rear section; and the front sections and the rear sections are the same or different in their plate thickness. Further, the upper plate can be assembled from a front plate member forming the front section, a middle plate member forming the middle section, and a rear plate member forming the rear section; and the front plate member and the rear plate member respectively have a plate thickness larger than that of the middle plate member.

Similarly, the lower plate can be assembled from a front plate member forming the front section, a middle plate member forming the middle section, and a rear plate member forming the rear section; and the front plate member and the rear plate member of the lower plate respectively have a plate thickness larger than that of the middle plate member of the lower plate.

In the present invention, the upper and the lower plate are made of a metal material, and the metal material can be an aluminum material, a stainless steel material, a copper material, a titanium material or an alloy material.

In the present invention, the heat dissipation unit can be a vapor chamber, a heat spreader or a flat heat pipe.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1A:
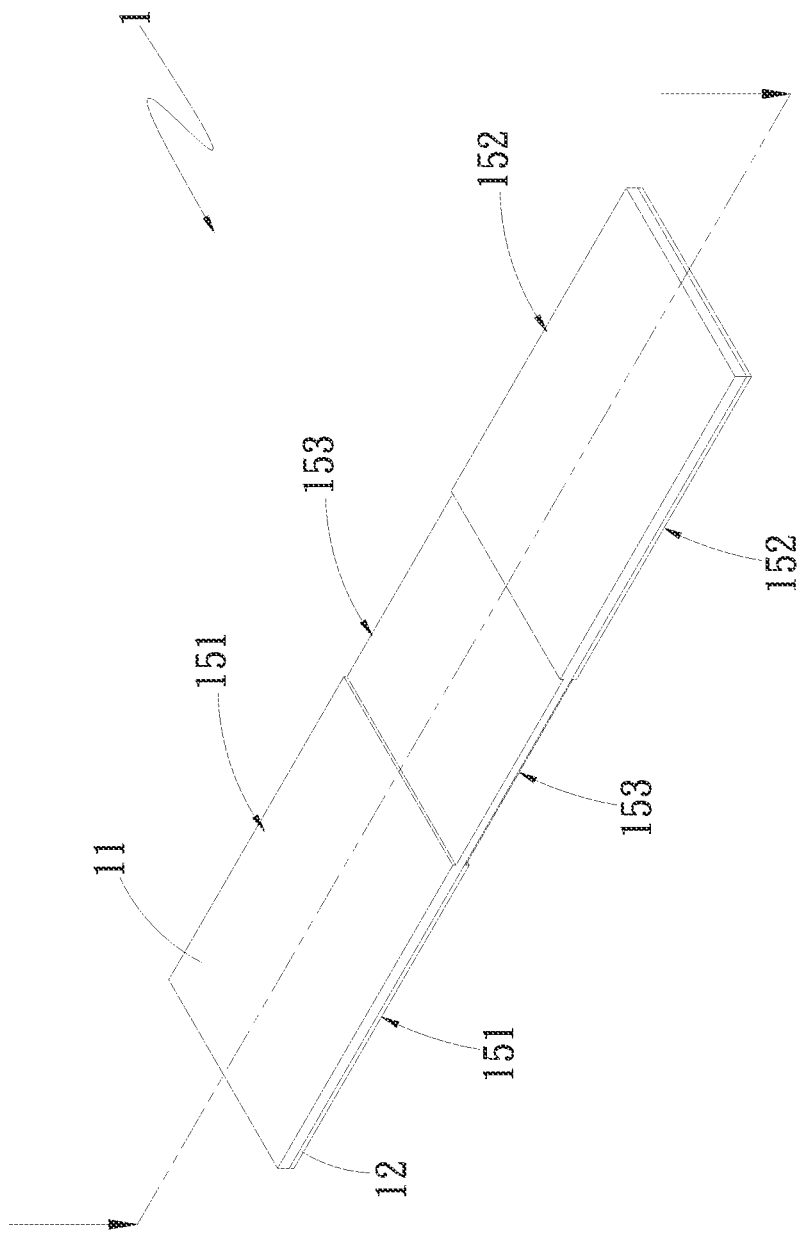
FIG. 1A is an assembled perspective view of a heat dissipation unit with floating section according to a first embodiment of the present invention.

The present invention will now be described with some preferred embodiments thereof and by referring to the accompanying drawings. For the purpose of easy to understand, elements that are the same in the preferred embodiments are denoted by the same reference numerals.

Figure 2:
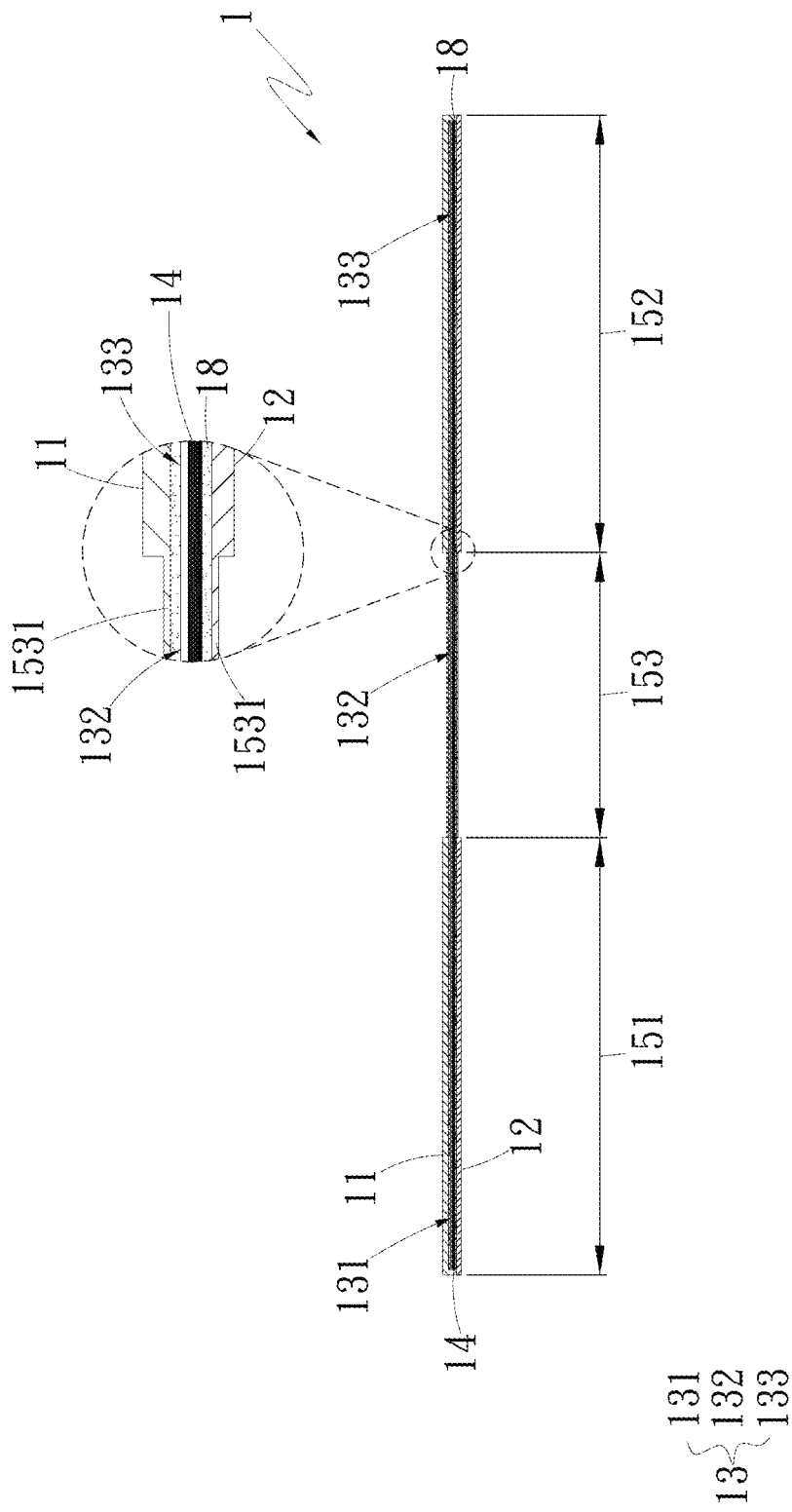
FIG. 2 is an assembled sectional view of the heat dissipation unit with floating section according to the present invention.

Please refer to FIGS. 1A and 2. The present invention provides a heat dissipation unit with floating section. For the purpose of conciseness and clarity, the present invention is also briefly referred to as the heat dissipation unit and is generally denoted by reference numeral 1 herein. In a first embodiment of the present invention, the heat dissipation unit 1 is described as a flat heat pipe. However, it is understood the flat heat pipe is only illustrative and not intended to limit the present invention in any way. In practical implementation of the heat dissipation unit 1, it can be otherwise a vapor chamber or a heat spreader. In the first embodiment, the heat dissipation unit 1 includes an upper plate 11 and a lower plate 12 fitly closed to each other. The upper plate 11 and the lower plate 12 can be made of a metal or a non-metal material. In the case of a metal material, it can be an aluminum material, a stainless steel material, a copper material, a titanium material or an alloy material. In the case of a non-metal material, it can be a plastic material, a ceramic material or a stone material.

The upper plate and the lower plate 11, 12 respectively have a front section 151, a rear section 152, and a middle section 153 located between and connected at two opposite ends to the front and the rear section 151, 152. The front sections 151 and the rear sections 152 respectively have a plate thickness larger than or equal to 0.5 mm, while the middle sections 153 respectively have a plate thickness of 0.08 mm and smaller than 0.5 mm. In the illustrated first embodiment of the present invention, the heat dissipation unit with floating section 1 is a flat heat pipe, of which the upper plate 11 and the lower plate 12 respectively have a front section 151 and a rear section 152 preferably having a plate thickness of 0.2 mm, and a middle section 153 having a plate thickness equal to 0.08 mm. It is understood the first embodiment is only illustrative and non-restrictive. In practical implementation of the present invention, the heat dissipation unit with floating section 1 can be otherwise a vapor chamber or a heat spreader, and the front and rear sections of its upper and lower plate 11, 12 preferably respectively have a plate thickness of 0.5 mm, while the middle sections 153 thereof preferably respectively have a plate thickness of 0.08 mm.

The front sections 151 and the rear sections 152 of any one or both of the upper and the lower plate 11, 12 have a plate thickness larger than that of the middle sections 153, such that the middle sections 153 respectively form a flexible floating section, which allow for a floating adjustment to different height levels relative to the front and/or the rear sections 151. 152. That is, when the flexible floating middle sections 153 are flexed or bent, their height levels relative to the front sections 151 and the rear sections 152 can be adjusted in a floating manner. In the illustrated first embodiment, the front sections 151 and the rear sections 152 of the upper plate 11 and the lower plate 12 are the same in their plate thickness, and are thicker than the middle sections 153. In other words, the front sections 151 and the rear sections 152 of the upper and lower plates 11, 12 all have a plate thickness of, for example, 0.2 mm, while the middle sections 153 of the upper and lower plates 11, 12 all have a plate thickness of, for example, 0.08 mm, which is thinner than 0.2 mm. With this arrangement, i.e. giving the middle sections 153 a plate thickness smaller than that of the front and rear sections 151, 152, it is possible for the thinner middle sections 153 of the upper and lower plates 11, 12 to form flexible floating sections, which can be flexed or bent upward, downward, leftward or rightward to allow a user to adjust two opposite ends of the heat dissipation unit 1 to different height levels in a floating manner, so that the heat dissipation unit 1 is adapted for mounting on between elements having a height difference, such as a heat-producing electronic element and another heat dissipation unit. Wherein, different numbers of the heat dissipation unit with floating section 1 according to the present invention, for example, two, can be used depending on the quantity of heat sources (not shown), such as two, that require heat dissipation.

In another operable embodiment of the present invention, the upper plate 11 (or the lower plate 12) includes a front section 151 and a rear section 152 that are different in their plate thickness, and the front and rear sections 151, 152 respectively have a plate thickness, e.g. 0.15 mm, larger than that of a middle section 153, e.g. 0.09 mm; while the lower plate 12 (or the upper plate 11) includes a front, a rear and a middle section 151, 152, 153 having the same plate thickness and accordingly, the middle section 153 thereof is not a flexible floating section. In the above illustrated example, only the middle section 153 of the upper plate 11 being thinner than the front and the rear section 151, 152 can form the flexible floating section to allow some slight floating adjustments only at one side of the heat dissipation unit 1.

Figure 1B:
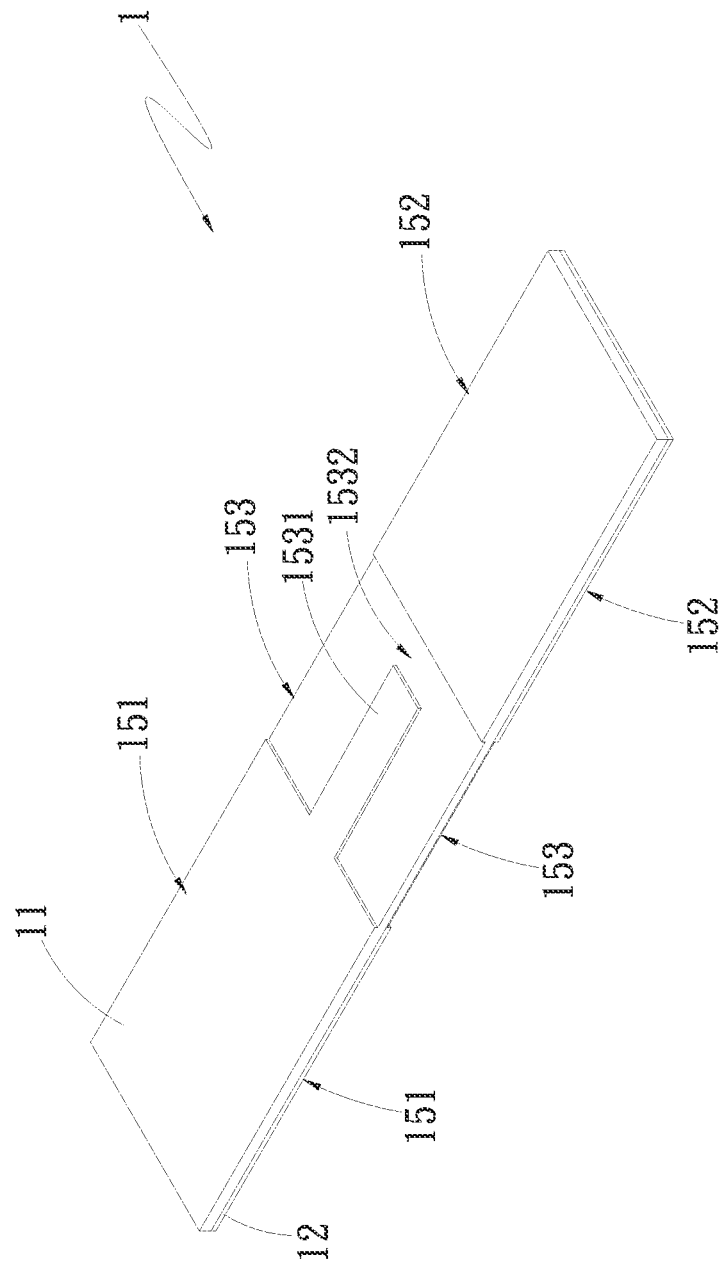
FIG. 1B is an assembled perspective view of a heat dissipation unit with floating section according to a second embodiment of the present invention.

Please refer to FIG. 1B, in which a second embodiment of the present invention is shown. In the second embodiment, the heat dissipation unit 1 further includes a reinforcing rib 1531 provided at the middle section 153 of the upper plate 11 or the lower plate 12. The reinforcing rib 1531 is connected to between the front section 152 and the middle section 153, or connected to between the middle section 153 and the rear section 152, or is extended from the front section 151 through the middle section 153 to the rear section 152. The reinforcing rib 1531 gives the thinner middle section 153 an increased structural strength and supports the middle section 153. In the illustrated second embodiment, the reinforcing rib 1531 has a free end that is not connected to the rear section 152 to thereby define a gap 1532 between the reinforcing rib 1531 and the rear section 152. The gap 1532 provides a space within which the middle section 153 can be finely adjusted to compensate the height difference between the heat dissipation unit 1 and a heat source.

According to the present invention, the lower plate 12 and the upper plate 11 closed to each other together define a chamber 13 in between them. In the chamber 13, vapor-liquid phase-change processes occur. A working fluid, such as pure water, is filled in the chamber 13, and a wick structure 18 is also provided in the chamber 13. The wick structure 18 can be a sintered powder structure, a plurality of grooves, a mesh structure, a fibrous structure, a braided strip structure or any combination thereof. The wick structure 18 can be provided on an inner side of the lower plate 12 or on inner sides of both of the upper and the lower plate 11, 12. An outer side of the front section 151 of the lower plate 12 is in contact with a heat source. The chamber 13 of the heat dissipation unit with floating section 1, such as a flat heat pipe, is internally divided into an evaporator area 131, a transport area 132 and a condenser area 133. The evaporator area 131 and the condenser area 133 are located in and corresponding to the front sections 151 and the rear sections 152 of the heat dissipation unit 1, respectively; and the transport area 132 is located in and corresponding to the middle sections 153 of the heat dissipation unit 1 and between the evaporator area 131 and the condenser area 133.

In practical application of the present invention, the heat dissipation unit 1 can be used in combination with other different or similar heat dissipation units and mounted on a plurality of heat sources, such as a central processing unit or a graphics processing unit on a mother board in an electronic device (not shown). In the case there is a height difference between two locations at where the front sections 151 and the rear sections 152 of the heat dissipation unit 1 are to be mounted, the flexible floating middle sections 153 can be flexed or bent upward, downward, leftward or rightward to compensate the height difference between the front and the rear sections 151, 152 and effectively reduce the bridging force that causes pull and push between the front and the rear sections 151, 152 that are located at different height levels, and further avoid a structural deformation of the heat dissipation unit 1. With the provision of the flexible floating middle sections 153, the heat dissipation unit 1 of the present invention can be adjusted in a floating manner and is therefore usable with various types of heat dissipation units located at different height positions.

With the above design, the heat dissipation unit with floating section 1 according to the present invention is allowed for a floating adjustment at the flexible floating middle sections thereof to thereby cover the height difference between different heat sources without causing a structural deformation of the heat dissipation unit 1 by a bridging force generated due to the height difference, which will lead to inward compression or outward pull of the heat dissipation unit 1 and accordingly, poor heat dissipation efficiency and even malfunction of the heat dissipation unit 1.

Further, the present invention can also be used on various electronic devices, such as servers, computers or communication chassis that include heat-producing elements having a height difference in location, such as a single chip and other heat-producing electronic elements on their mother boards. Any height difference between two ends, i.e. the front sections 151 and the rear sections 152, of the heat dissipation unit 1 correspondingly mounted on the heat-producing elements can be covered by a floating adjustment at the flexible floating middle sections 153, so that the two ends of the heat dissipation unit 1 can be always in flat contact with the corresponding heat sources or other similar or different types of heat dissipation units that have a height difference between them.

In an alternative embodiment of the present invention, the upper plate 11 and the lower plate 12 of the heat dissipation unit 1 are respectively assembled from the front section 151, the middle section 153 and the rear section 152. In this case, the front, middle and rear sections 151, 153, 152 are respectively in the form of a plate member, i.e. a front plate member, a middle plate member, and a rear plate member. Wherein, the front and the rear plate members of the upper plate 11 have a plate thickness larger than that of the middle plate member thereof; and the front and the rear plate members of the lower plate 12 have a plate thickness larger than that of the middle plate member thereof.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A heat dissipation unit with floating section comprising:
an upper plate having a front section, a rear section, and a middle section located between the front and the rear sections;
a lower plate having a front section, a rear section, and a middle section located between the front and the rear sections and wherein the lower plate is sealed to the upper plate to together define the heat dissipation unit with flexible floating section with a chamber in between them;
a reinforcing rib disposed on an exterior surface of the middle section of one or both of the upper and of the lower plate and extended from at least one part of the respective front section or rear section to support the respective middle section and wherein the reinforcing rib has a free end defining a gap between the reinforcing rib and the respective rear section or front section, respectively; and
a working fluid filled in the chamber, wherein the front section and the rear section of one or both of the upper and the lower plate have a plate thickness greater than that of the respective middle section, such that one or both of the middle sections define the flexible floating section configured for a floating adjustment thereat.

2. The heat dissipation unit with floating section as claimed in claim 1, wherein the chamber is provided on an inner side of the lower plate or on inner sides of both of the upper and of the lower plate with a wick structure.

3. The heat dissipation unit with floating section as claimed in claim 1, wherein the front and the rear sections have a plate thickness greater than or equal to 0.5 mm; and the middle section of at least one of the upper and the lower plate has a plate thickness of at least 0.08 mm and less than 0.5 mm.

4. The heat dissipation unit with floating section as claimed in claim 1, wherein the front sections and the rear sections are the same or different in their plate thickness.

5. The heat dissipation unit with floating section as claimed in claim 1, wherein the upper and the lower plate are made of a material selected from the group consisting of an aluminum material, a stainless steel material, a copper material, a titanium material, and an alloy material.

6. The heat dissipation unit with floating section as claimed in claim 1, wherein the heat dissipation unit is selected from the group consisting of a vapor chamber, a heat spreader and a flat heat pipe.

\* \* \* \* \*